United States Patent
Lin et al.

(10) Patent No.: US 8,552,559 B2
(45) Date of Patent: Oct. 8, 2013

(54) VERY THICK METAL INTERCONNECTION SCHEME IN IC CHIPS

(75) Inventors: Mou-Shiung Lin, Hsin-Chu (TW);
Chiu-Ming Chou, Kao-Hsiung (TW);
Chien-Kang Chou, Shin-Hwa Town (TW)

(73) Assignee: Megica Corporation, Hsinchu (TW)

( * ) Notice: Subject to any disclaimer, the term of this patent is extended or adjusted under 35 U.S.C. 154(b) by 1027 days.

(21) Appl. No.: 11/087,955

(22) Filed: Mar. 23, 2005

(65) Prior Publication Data
US 2006/0022343 A1    Feb. 2, 2006

Related U.S. Application Data

(60) Provisional application No. 60/592,358, filed on Jul. 29, 2004.

(51) Int. Cl.
*H01L 23/48* (2006.01)
*H01L 23/52* (2006.01)
*H01L 29/40* (2006.01)

(52) U.S. Cl.
USPC ........... 257/758; 257/503; 257/750; 257/760; 257/762; 257/E23.019; 257/E23.145; 257/E23.151; 257/E23.161; 257/E23.18; 257/E23.169; 257/E23.175; 257/E21.575; 257/E21.579; 257/E21.584; 257/E21.59; 257/E27.001; 257/E27.014; 257/E27.112; 257/E29.175; 438/622; 438/686; 438/687; 438/688

(58) Field of Classification Search
USPC .......... 257/758, E27.001, 500, 700, E23.019, 257/E23.142, E23.145, E23.151, E23.161, 257/E23.168, E23.169, E23.175, E21.575, 257/E21.579, E21.584, E21.585, E21.59; 438/686–688
See application file for complete search history.

(56) References Cited

U.S. PATENT DOCUMENTS

| | | | | |
|---|---|---|---|---|
| 5,417,800 A | * | 5/1995 | Takeshita | 216/13 |
| 5,430,329 A | * | 7/1995 | Harada et al. | 257/786 |
| 5,985,765 A | * | 11/1999 | Hsiao et al. | 438/694 |
| 6,184,143 B1 | * | 2/2001 | Ohashi et al. | 438/697 |
| 6,235,648 B1 | * | 5/2001 | Mizuhara et al. | 438/783 |
| 6,291,331 B1 | * | 9/2001 | Wang et al. | 438/618 |
| 6,303,423 B1 | * | 10/2001 | Lin | 438/238 |
| 6,339,029 B1 | | 1/2002 | Yu et al. | |
| 6,383,916 B1 | | 5/2002 | Lin | 438/637 |
| 6,441,467 B2 | | 8/2002 | Toyosawa et al. | |
| 6,451,681 B1 | * | 9/2002 | Greer | 438/601 |

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Meiya Li
(74) *Attorney, Agent, or Firm* — Seyfarth Shaw LLP

(57) ABSTRACT

A new interconnection scheme is described, comprising both coarse and fine line interconnection schemes in an IC chip. The coarse metal interconnection, typically formed by selective electroplating technology, is located on top of the fine line interconnection scheme. It is especially useful for long distance lines, clock, power and ground buses, and other applications such as high Q inductors and bypass lines. The fine line interconnections are more appropriate to be used for local interconnections. The combined structure of coarse and fine line interconnections forms a new interconnection scheme that not only enhances IC speed, but also lowers power consumption.

88 Claims, 5 Drawing Sheets

(56) References Cited

U.S. PATENT DOCUMENTS

| | | | |
|---|---|---|---|
| 6,479,900 B1 | 11/2002 | Shinogi et al. | |
| 6,495,442 B1 | 12/2002 | Lin et al. | 438/618 |
| 6,713,875 B2* | 3/2004 | Farrar | 257/767 |
| 6,900,541 B1* | 5/2005 | Wang et al. | 257/758 |
| 6,908,841 B2* | 6/2005 | Burrell et al. | 438/612 |
| 7,115,985 B2 | 10/2006 | Antol et al. | |
| 7,719,116 B2 | 5/2010 | Wakabayashi et al. | |
| 7,723,849 B2 | 5/2010 | Ohmori et al. | |
| 2001/0045651 A1* | 11/2001 | Saito et al. | 257/750 |
| 2002/0000665 A1 | 1/2002 | Barr et al. | |
| 2002/0037643 A1* | 3/2002 | Ishimaru | 438/642 |
| 2002/0127846 A1* | 9/2002 | Burrell et al. | 438/627 |
| 2002/0149105 A1* | 10/2002 | Yoon et al. | 257/737 |
| 2003/0025202 A1 | 2/2003 | Mikagi et al. | |
| 2003/0030146 A1* | 2/2003 | Tamaru et al. | 257/762 |
| 2003/0047794 A1* | 3/2003 | Watanabe | 257/503 |
| 2003/0134496 A1* | 7/2003 | Lee et al. | 438/612 |
| 2003/0214041 A1* | 11/2003 | Suzuki et al. | 257/758 |
| 2004/0140564 A1* | 7/2004 | Lee et al. | 257/758 |
| 2004/0150112 A1* | 8/2004 | Oda | 257/758 |
| 2004/0169255 A1* | 9/2004 | Kiyotoshi | 257/532 |
| 2005/0037609 A1 | 2/2005 | Nakatani | |
| 2005/0074959 A1* | 4/2005 | Burrell et al. | 438/617 |
| 2006/0267198 A1 | 11/2006 | Lin et al. | |
| 2008/0006945 A1 | 1/2008 | Lin et al. | |
| 2008/0042280 A1 | 2/2008 | Lin et al. | |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) p. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

VERY THICK METAL INTERCONNECTION SCHEME IN IC CHIPS

This application claims priority to U.S. Provisional Patent Application Ser. No. 60/592,358, filed on Jul. 29, 2004, which is herein incorporated by reference in its entirety.

BACKGROUND OF THE INVENTION (1) Field of the Invention

The invention relates to the manufacturing of high speed, low power consumption, low voltage, and/or high current Integrated Circuit (IC) chips, and, more specifically, to methods of creating fine line interconnections and coarse metal interconnections on top of the fine line interconnections for high speed, low power consumption, low voltage, and/or high current (IC) chips.

(2) Description of the Related Art

When the dimensions of Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

Since the 1960's, sputtered aluminum has become a main stream IC interconnection metal material. The aluminum film is sputtered covering the whole wafer, and then the metal is patterned using photolithography methods and dry and/or wet etching. It is technically difficult and economically expensive to create thicker than 2 µm aluminum metal lines due to the cost and stress concerns of blanket sputtering. About 1995, damascene copper metal became an alternative for IC metal interconnection. In damascene copper, the insulator is patterned and copper metal lines are formed within the insulator openings by blanket electroplating copper and chemical mechanical polishing (CMP) to remove the unwanted copper. Electroplating the whole wafer with thick metal creates large stress and carries a very high material (metal) cost. Furthermore, the thickness of damascene copper is usually defined by the insulator thickness, typically chemical vapor deposited (CVD) oxides, which does not offer the desired thickness due to stress and cost concerns. Again it is also technically difficult and economically expensive to create thicker than 2 µm copper lines.

U.S. Pat. No. 6,495,442 to M. S. Lin et al and U.S. Pat. No. 6,383,916 to M. S. Lin, add, in a post passivation processing sequence, a thick layer of dielectric over a layer of passivation and layers of wide and thick metal lines on top of the thick layer of dielectric.

SUMMARY OF THE INVENTION

It is the primary objective of the invention to provide a new interconnection scheme especially useful for high speed, low power consumption, low voltage, and/or high current IC chips.

Another objective of the invention is to provide a selective electroplating method for forming a thick metal, as thick as 20 microns.

It is yet another objective of the invention to provide a new interconnection scheme comprising both coarse and fine line interconnection schemes in an IC chip.

A further objective of the invention is to provide a method for fabricating a coarse interconnection scheme overlying a fine line interconnection scheme.

A still further objective of the invention is to provide a method for fabricating a coarse interconnection scheme by an embossing process.

In accordance with the objectives of the invention, a method of forming coarse and fine line interconnection schemes in an IC chip is achieved. A semiconductor substrate is provided. A fine line metal interconnection structure comprising one or more layers of metals is provided overlying the semiconductor substrate. A coarse metal interconnect structure is formed over the fine line metal interconnection structure by an embossing process. A passivation layer is provided overlying the coarse metal interconnection structure.

Also in accordance with the objectives of the invention, a metal interconnection scheme comprising both fine line and coarse metal schemes is achieved. A semiconductor substrate is provided. Fine line metal interconnection comprising one or more layers of metals overlying the semiconductor substrate is provided. A coarse metal interconnection structure in one layer is provided and is overlying the fine line metal interconnection; said coarse metal interconnection is further covered by a passivation layer.

DESCRIPTION OF THE PREFERRED EMBODIMENTS

The present invention discloses a new IC interconnection scheme that is especially useful for high speed, low power consumption, low voltage, and/or high current IC chips, typically formed on semiconductor wafers. The invention also discloses an embossing process, a selective electroplating method to form a thick metal, as thick as 20 microns. Incorporating this embossing method, a new interconnection scheme is described, comprising both coarse and fine line interconnection schemes in an IC chip. The coarse metal interconnection, typically formed by selective electroplating technology, is located on top of the fine line interconnection scheme. It is especially useful for long distance lines, clock, power and ground buses, and other applications such as high Q inductors and bypass lines. The fine line interconnections are more appropriate to be used for local interconnections. The combined structure of coarse and fine line interconnections forms a new interconnection scheme that not only enhances IC speed, but also lowers power consumption.

Figure 1:
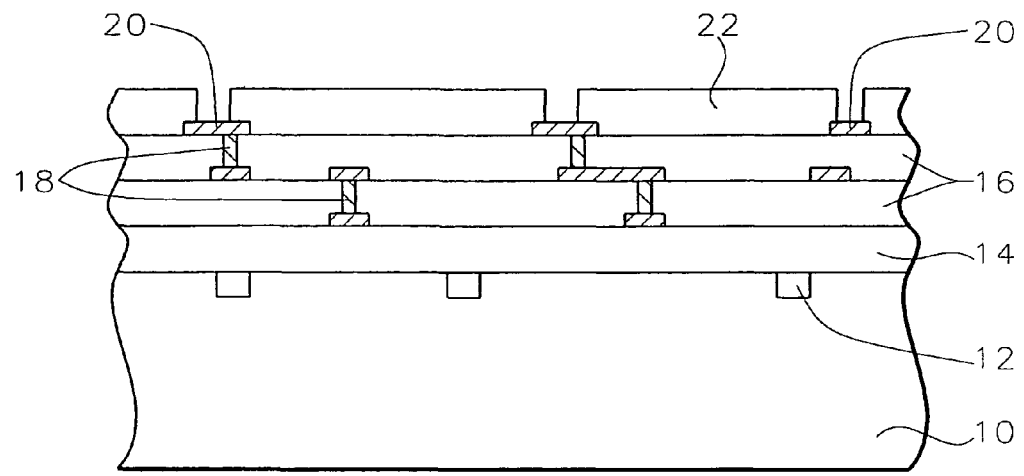
FIG. 1 is a cross sectional representation of a fine line interconnection scheme of the prior art.

FIG. 1 illustrates an IC chip of the prior art. As FIG. 1 depicts, the entire interconnection scheme of the IC chip is made of the fine pitch metal wires whose typical width/thickness is less than about 2 microns. The manufacturing process of such a structure is the damascene process which deposits a blanket film of metal conductor on the dielectric layer with traces formed by micro-lithography processes. The blanket film is then subjected to a planarizing process, such as chemical mechanical polishing (CMP) to remove the unwanted metal material located outside of the traces. Only the metal body in the traces remains after the CMP process. Semiconductor device structures 12 are shown in and on the semiconductor substrate 10. The device structures are covered with an insulating layer 14. Fine line interconnections 18 are formed within dielectric layers 16. Typically, the intermetal dielectric (IMD) layers 16 comprise silicon-based oxides, such as silicon dioxide formed by a chemical vapor deposition (CVD) process, CVD TEOS oxide, spin-on-glass (SOG), fluorosilicate glass (FSG), high density plasma CVD oxides, or a composite layer formed by a portion of this group of materials. The IMD layers typically have a thickness of between about 1000 and 10,000 Angstroms. Passivation layer 22 is shown with openings to top fine line metal pads 20.

In the present invention, the embossing process to form the coarse interconnection scheme is different from the damascene process used in the prior art as shown above. FIGS. 2-5 show a preferred embodiment of the present invention. In this invention, multiple layers of metal conductor with different thickness/width form the entire IC interconnection. Specifically, the metal layers can be divided into two segments—top and lower metal schemes. The top metal scheme is formed by coarse metal bodies; that is gold or copper with a thickness greater than about 3 microns. The lower metal scheme is formed by fine line interconnection; that is, copper or aluminum having a thickness of less than about 2 microns. Between these two interconnection schemes lies a diffusion barrier, made of, for example, oxynitride or nitride, which is deposited to prevent the transition metal used in the coarse metal scheme from penetrating into the fine line circuitry/device area. The thickness of the transitional metal diffusion barrier is about 400 to 1000 Angstroms.

Figure 2:
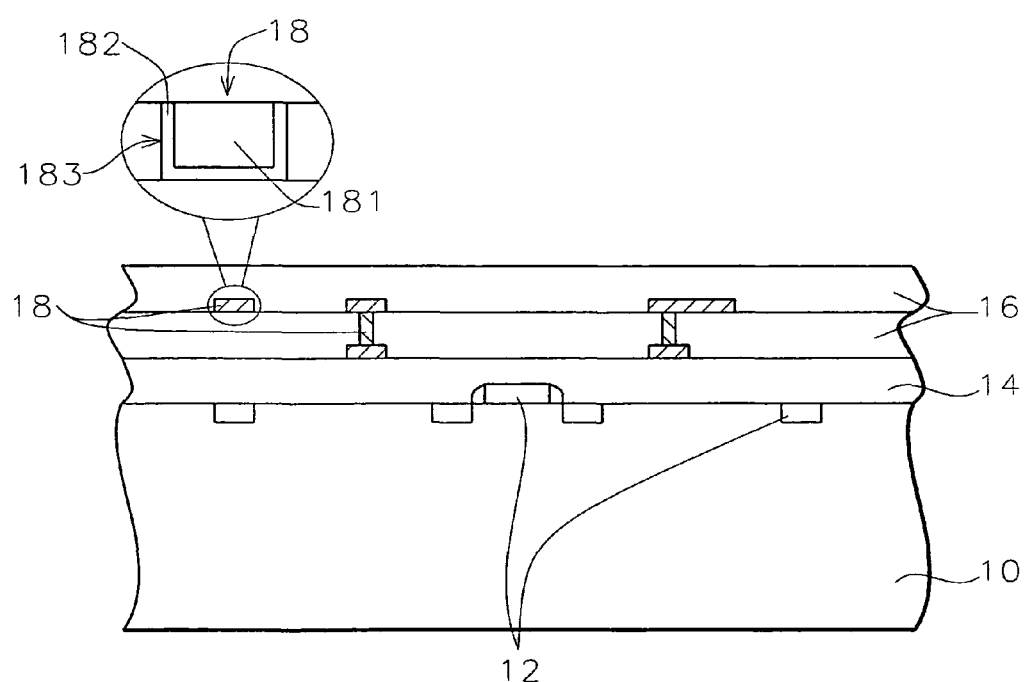
FIGS. 2-7 are cross sectional representations of a first preferred embodiment of the present invention.

Referring now more particularly to FIG. 2, there is shown a semiconductor substrate 10. Transistors and other devices 12 are formed in and on the substrate. The surface of substrate 10 is covered by an insulating layer 14, formed over the devices.

Layers 16 contain one or more layers of dielectric, interspersed with one or more metal interconnect lines 18 that make up a network of electrical connections. These metal layers are referred to as fine line metal interconnections. Typically, the intermetal dielectric (IMD) layers comprise silicon-based oxides, such as silicon dioxide formed by a chemical vapor deposition (CVD) process, CVD TEOS oxide, spin-on-glass (SOG), fluorosilicate glass (FSG), high density plasma CVD oxides, or a composite layer formed by a portion of this group of materials. The IMD layers typically have a thickness of between about 1000 and 10,000 Angstroms. The fine line metal interconnections are typically formed by sputtering aluminum or an aluminum alloy and patterning the aluminum to form the fine metal lines. Typically, the aluminum layer has a thickness less than 2 micrometers. Alternatively, the fine lines may be formed by a copper damascene process. In the copper damascene process, the copper 181 is protected by an adhesion/barrier layer 182 not only underlying the copper 181, but also surrounding the copper 181 at the sidewalls 183 of the line 18 through the IMD. Typically, the damascene copper layer 181 has a thickness less than 2 micrometers. These fine lines typically have a thickness of less than about 2 microns. In the fabrication process of the fine line metal interconnections, a typical clean room environment of class 10 or less is required; that is, having no more than 10 particles larger than 0.5 microns in any given cubic foot of air. The fine line IC metal is fabricated using 5.times.steppers or scanners or better and using a photoresist layer having thickness of less than 5 microns.

Figure 3:
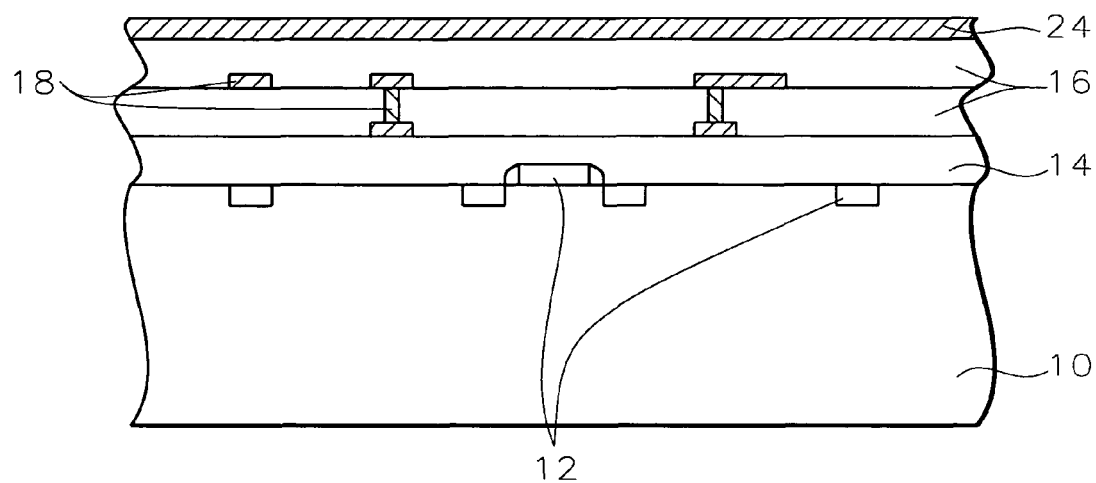

Now, in a key feature of the present invention shown in FIG. 3, a transition metal diffusion barrier layer 24 is deposited over the entire surface of the topmost IMD layer 16. The transition metal diffusion barrier layer is formed of, for example, silicon oxynitride or silicon nitride and functions to prevent the penetration of the transition metal used in the coarse metal scheme (such as gold, copper, silver) into the fine line circuitry and device areas. The barrier layer 24 has a thickness of between about 100 and 5000 Angstroms. The diffusion barrier 24 forms a global diffusion layer to protect all of the underlying fine line metal circuitry and devices.

Figure 4:
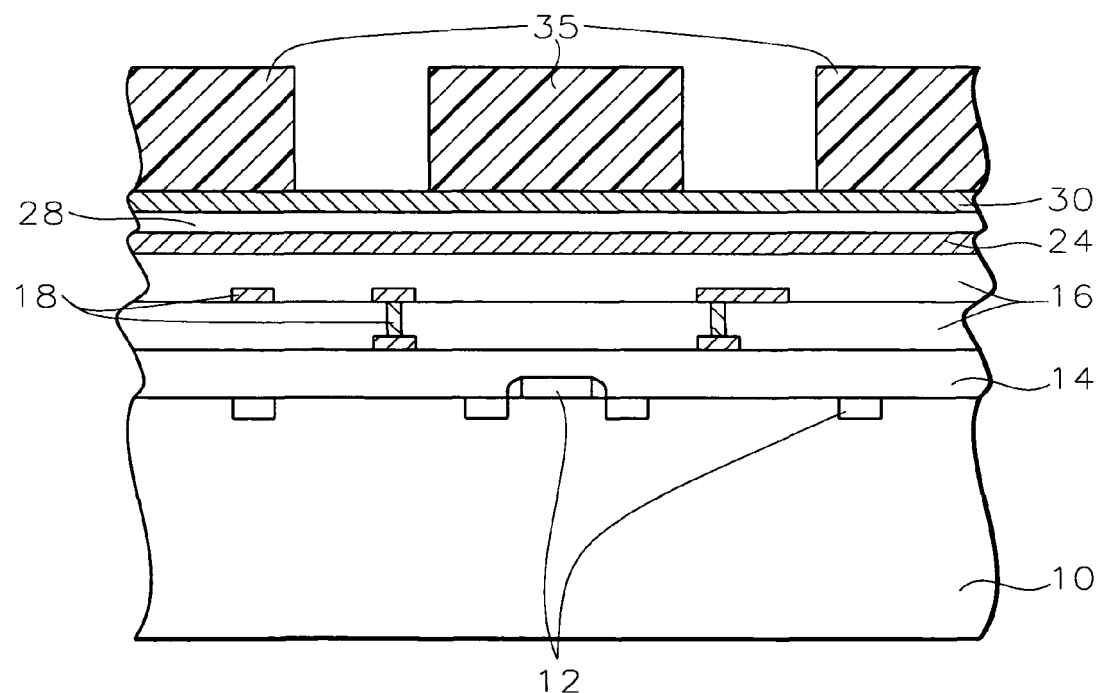

Now, the embossing process of the present invention will be described. The inventive embossing process is a selective deposition process used to form the coarse metal interconnection scheme of the present invention. Referring to FIG. 4, an adhesion/diffusion barrier layer 28 is deposited over the transition metal barrier layer 24. The adhesion/diffusion barrier layer 28, preferably comprising TiW, TiN, TaN, Ti, Ta, or C, is deposited, preferably by sputtering to a thickness of between about 100 and 5,000 Angstroms. A seed layer 30 is next sputter deposited over the adhesion/diffusion barrier layer 28, to a thickness of between about 300 and 3,000 Angstroms.

A thick photoresist is deposited over the seed layer to a thickness greater than the desired bulk metal thickness. Conventional lithography is used to expose the seed layer 30 in those areas where the coarse metal lines are to be formed, as shown by mask layer 35 in FIG. 4.

Figure 5:
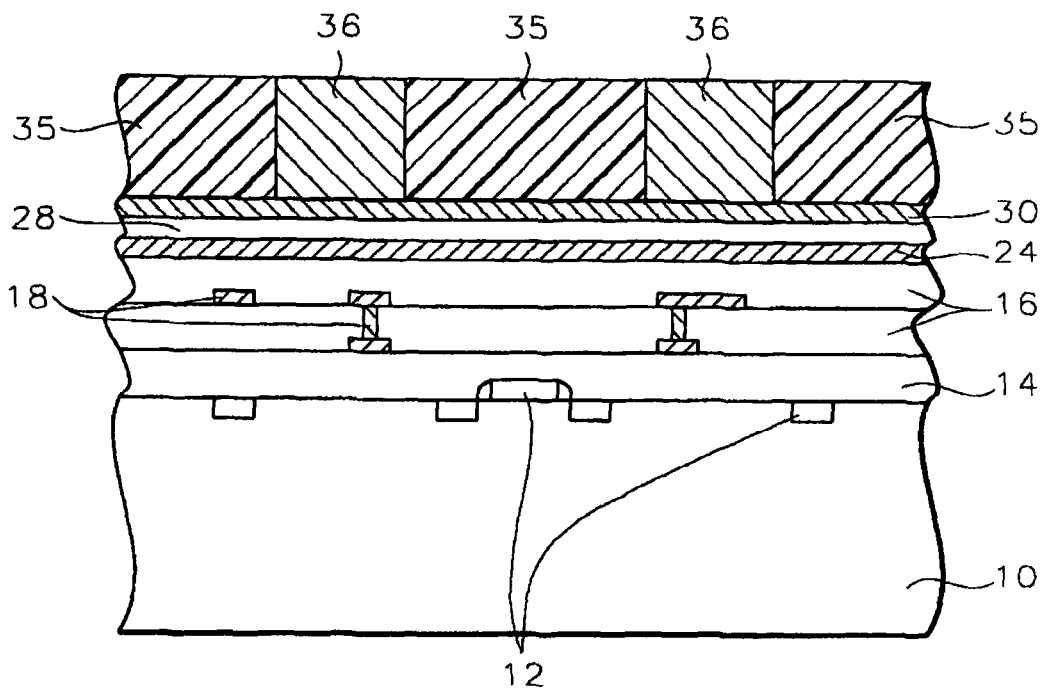
Figure 6:
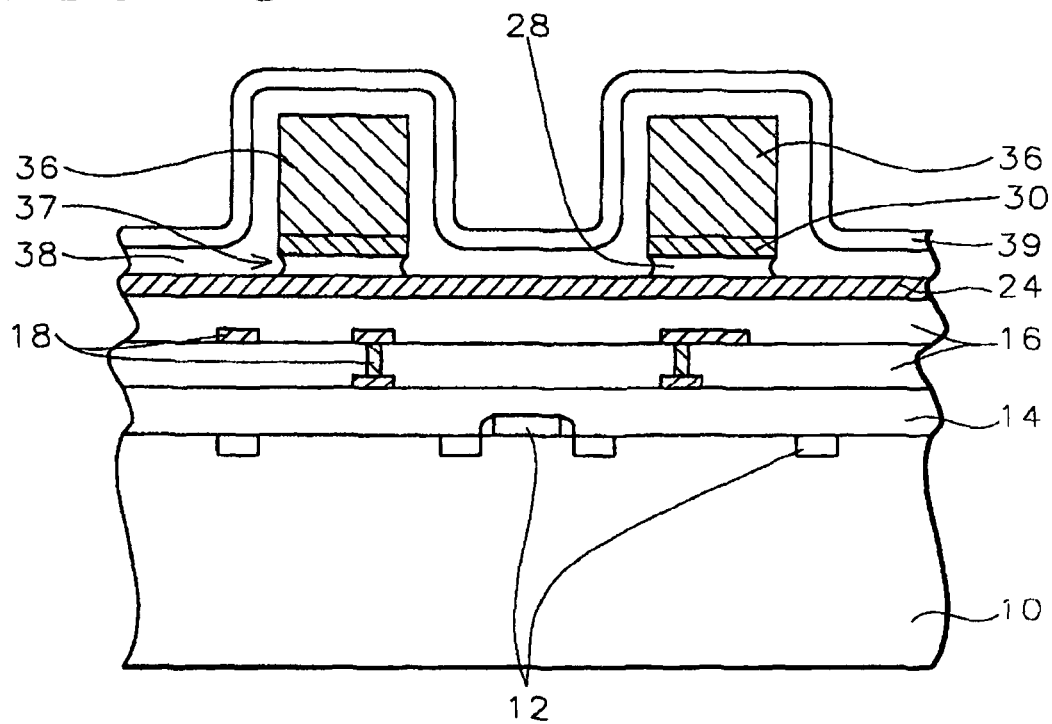

Referring now to FIG. 5, a bulk metal layer 36 is next formed by electroplating, to a thickness of greater than about 3 μm and as thick as 20 μm, or more. The bulk metal may be gold, copper, or silver. Now, the photoresist mask is removed and the seed layer and adhesion/diffusion barrier layer not covered by the bulk metal are removed, as shown in FIG. 6. Bulk metal 36 forms the coarse metal lines of the invention. The structure of the coarse metal lines is different from the structure of the fine line metallization. An undercut 37 is formed in the adhesion/barrier layer during removal of the adhesion/barrier layer. Furthermore, there is a clear boundary between the sputtered thin seed layer 30 and the electroplated thick bulk metal 36. This can be seen, for example, in a transmission electron microscope (TEM) image. The boundary is due to different grain sizes and/or grain orientation in the two metal layers 30 and 36. For example, when the seed layer 30 is a 1,000 Angstroms thick sputtered gold layer under the bulk metal layer 36 of a 4 microns thick electroplated gold layer 36, the grain size of the seed layer 30 of the sputtered gold layer is about 1,000 Angstroms, and the grain boundary is perpendicular to the surface of substrate. The grain size of the bulk metal layer 36 of electroplated gold is greater than 2 microns with the grain boundary not perpendicular, and typically, at an angle of about 45 degrees from the substrate surface. In the fine line metal interconnections, there is no undercutting or clear boundary of grain size difference inside the aluminum or copper damascene layer.

In more detail, the clean room environment of the coarse metal embossing process can be class 100 or more; that is, containing more than 100 particles larger than 0.5 microns in any given cubic foot of air. During photolithography in the coarse metal embossing process, aligners or 1× steppers are used with a photoresist having a thickness of greater than about 5 microns. This contrasts with the fine line IC metal, fabricated using 5× steppers or scanners or better in a class 10 environment or better and using a photoresist layer having thickness of less than 5 microns.

Figure 7:
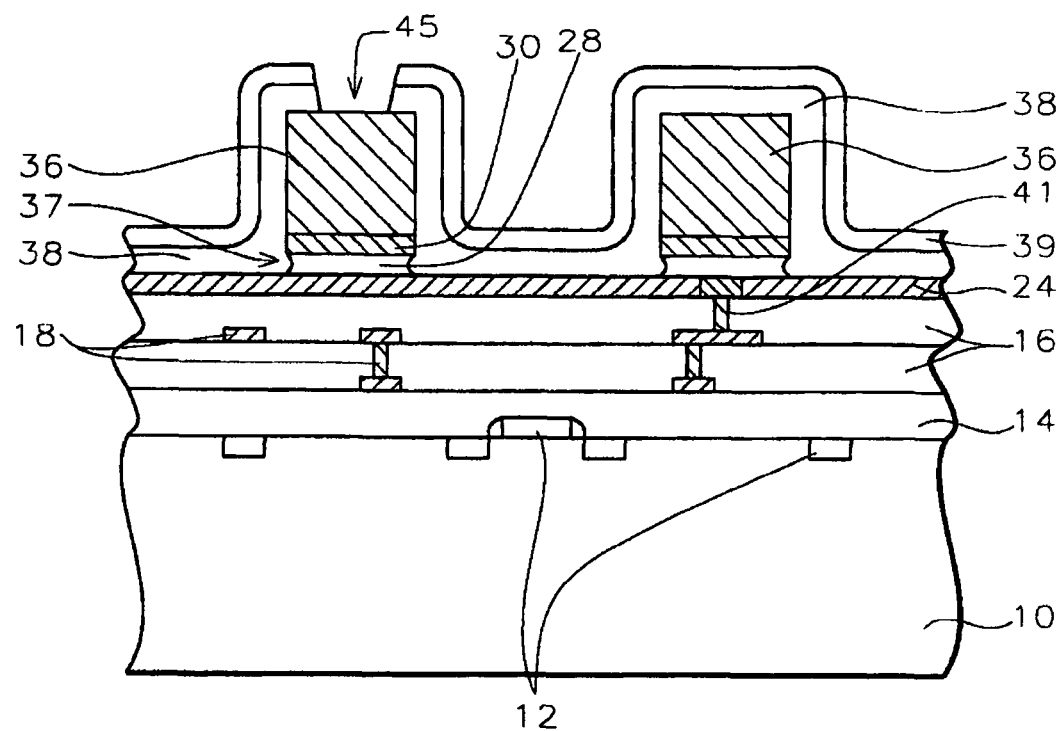

A passivation layer is still needed to cover the entire interconnection scheme so as to avoid contamination and moisture from the ambient. This passivation layer is more robust to resist the aggressing of various foreign atoms, including moisture and mobile ions, from passing through the passivation layer. The passivation layer usually consists of multiple layers of materials and at least comprises a silicon nitride layer thicker than 4000 Angstroms. More importantly, the passivation layer is also used to prevent mechanical scratches during handling, while the transition metal diffusion barrier is only used for preventing the penetration of gold, silver, or copper. In a first preferred embodiment of the invention, the passivation layer is deposited over the coarse metal lines as shown in FIG. 6. The passivation layer may comprise multiple layers and have a thickness of greater than 10,000 Angstroms. For example, the passivation layer may comprise a first inorganic dielectric layer such as an oxide layer deposited by plasma-enhanced chemical vapor deposition (PECVD) 38. Layer 39 comprises silicon nitride. Layers 38 and 39 together comprise the passivation layer. An opening 45 may be made through the passivation layer to make external connection to the coarse metal line 36, as shown in FIG. 7. FIG. 7 also illustrates an interconnection 41 between the fine line metal interconnections 18 and the coarse metal lines including the adhesion/diffusion barrier layer 28, the seed layer 30 and the bulk metal layer 36.

Figure 8:
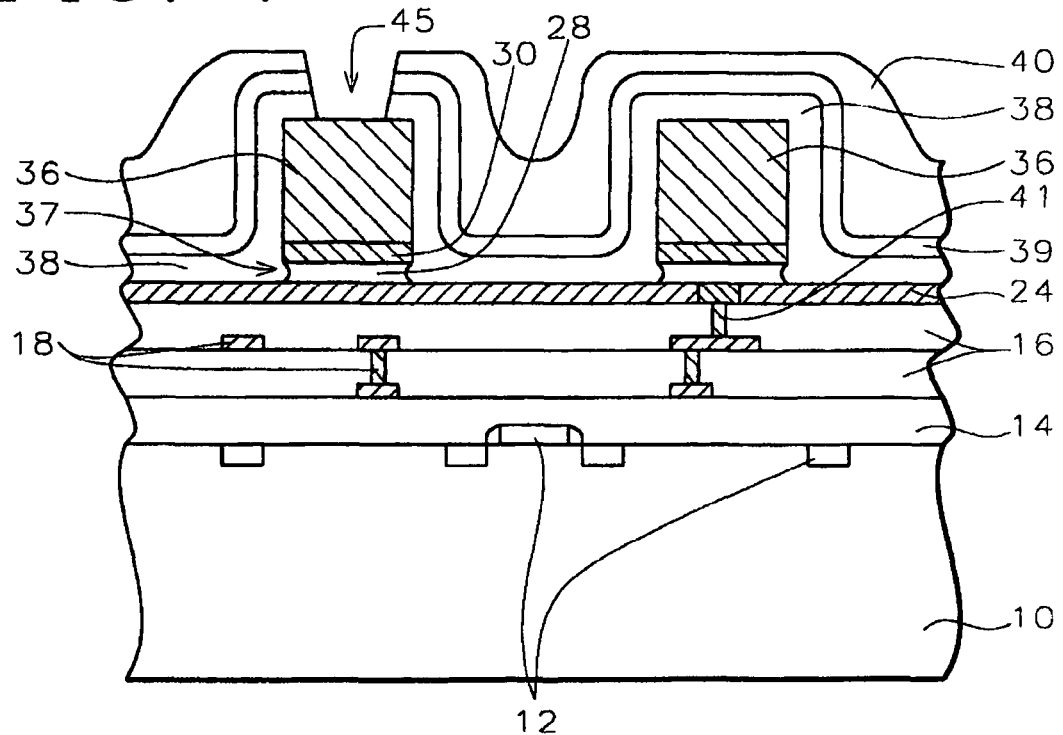
FIG. 8 is a cross sectional representation of a second preferred embodiment of the present invention.

FIG. 8 illustrates a second preferred embodiment of the present invention. After the passivation layer 38/39, as described above, is deposited, a polymer layer 40 may be deposited to planarize the chip structure. For example, the polymer may be polyimide having a thickness in excess of 2 μm (after curing). The range of the polymer thickness can vary from 2 μm to 150 μm, dependent on electrical design requirements. For a thicker layer of polyimide, the polyimide film can be multiple coated and cured. The polymer is formed by spin-on, printing, or laminating. Polymer 40 may optionally be photosensitive. Examples of other polymers that can be used include benzocyclobutene (BCB), epoxy-based material such as photoepoxy SU-8 (available from Sotec Microsystems, Renens, Switzerland), or low dielectric constant (k) materials such as parylene. The planarization process helps the photolithographic process to open the contact pads as shown by 45 on FIG. 8.

Figure 9:
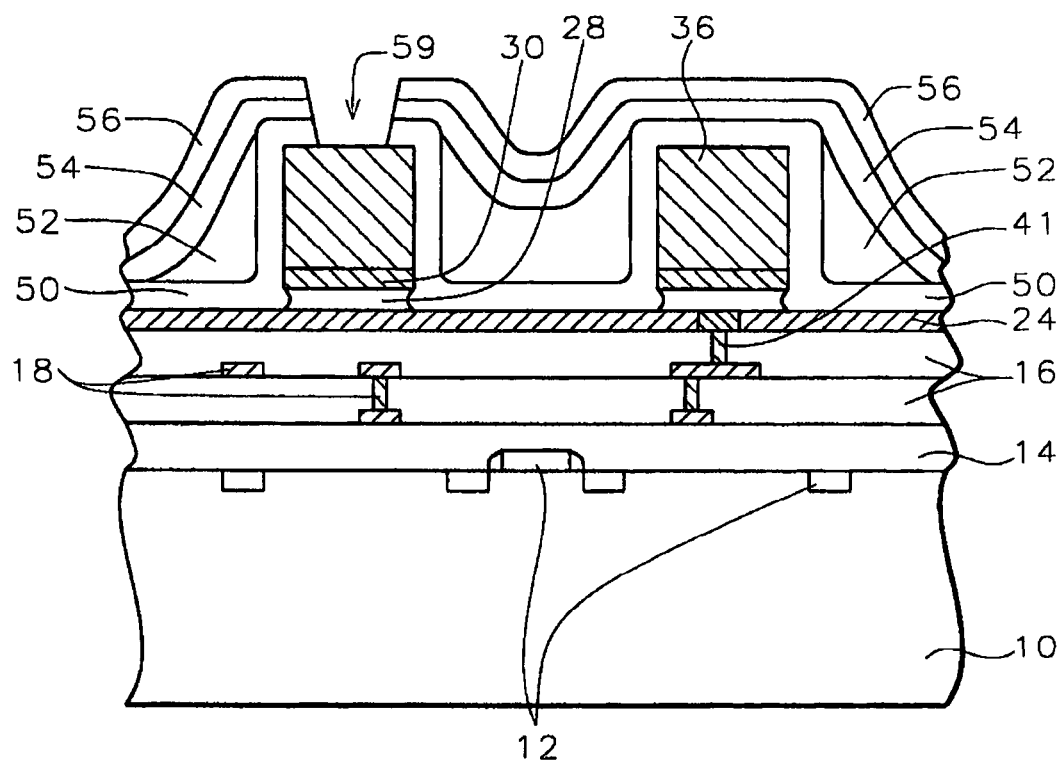
FIG. 9 is a cross sectional representation of a third preferred embodiment of the present invention.

In a third preferred embodiment of the invention, multiple dielectric layers are deposited on the coarse metal conductor to planarize its topography prior to the passivation layer deposition process. It may be necessary to deposit organic or inorganic dielectric layers between the coarse metal interconnection structure and the passivation layer because there may be voids in the passivation layer. Any number and variety of appropriate layers may be deposited to achieve planarization before depositing the passivation layer. For example, as shown in FIG. 9, an inorganic dielectric layer such as an oxide layer deposited by plasma-enhanced chemical vapor deposition (PECVD) 50 is formed over the coarse metal lines 36. Next, a spin-on-glass layer 52 may be coated, followed by etching back of the spin-on-glass layer to conform to the morphology of the metal lines. Then, a second PE-oxide layer 54, for example, may be deposited. A polymer layer such as parylene may be deposited as one of the planarizing layers.

The passivation layer 56 may now be deposited on the dielectric layers thus forming a smoother morphology. The passivation layer 56 may be silicon nitride alone, or in combination with other layers as described in the first and second embodiments. This smooth morphology characteristic is important to subsequent micro-lithography processes whose depth of focus can be quite small. This characteristic is also helpful for the silicon nitride-based passivation layer to avoid generating micro-cracks around the sharp corners that might be formed by the coarse interconnection metal body. An opening 59 shown in FIG. 9 through the passivation layer 56, the second PE oxide layer 54 and the oxide layer 50 is over the bulk metal 36 and exposes the bulk metal 36.

Sheet resistance is calculated by dividing the resistivity of the metal by the metal thickness. Sheet resistance is independent of metal line width and length. For example, resistivity of aluminum is 2.74 micro-ohm-cm, resistivity of copper is 1.70 micro-ohm-cm, and resistivity of gold is 2.2 micro-ohm-cm. In fine line metallization, for aluminum lines having a thickness of 0.8 μm, the sheet resistance is 35 milliohms per square. Damascene copper lines having a thickness of one micron have a sheet resistance of 20 milliohms per square. In contrast, the coarse metal lines of the present invention have a metal sheet resistance of less than 7 milliohms per square. If the coarse metal line is a 5.0 μm thick copper line, the sheet resistance is 4 milliohms per square. If the coarse metal line is a 4.0 μm thick gold line, the sheet resistance is 5.5 milliohms per square.

In summary, the sheet resistance of the coarse metal is at least two times smaller than the sheet resistance of the fine line metal. As shown in the examples above, the sheet resistance of the coarse metal can be five times smaller than the sheet resistance of the fine line metal.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. An integrated circuit chip comprising:
   a semiconductor substrate;
   multiple transistors in and on said semiconductor substrate;
   an insulating layer over said semiconductor substrate;
   a first metallization structure over said insulating layer, wherein said first metallization structure comprises a first metal layer and a second metal layer over said first metal layer, wherein said first metallization structure comprises a metal line comprising a copper portion, and said first metallization structure further comprises a first adhesion layer under said copper portion and at sidewalls of said metal line, wherein said metal line has a thickness less than 2 micrometers;
   a dielectric layer between said first and second metal layers;
   a first insulating nitride layer over said first metallization structure and over said dielectric layer;
   a second metallization structure on and in physical contact with a top surface of said first insulating nitride layer, wherein said second metallization structure comprises a second adhesion layer on said first insulating nitride layer, and an electroplated copper layer over said second adhesion layer, wherein said second adhesion layer physically contacts said top surface of said first insulating nitride layer, wherein said second adhesion layer is under said electroplated copper layer, but is not at sidewalls of said electroplated copper layer, wherein said electroplated copper layer has a thickness greater than 3 micrometers;
   a separating layer on said second metallization structure and on and in physical contact with said top surface of said first insulating nitride layer, wherein said separating layer physically contacts a top surface of said electroplated copper layer and said sidewalls of said electroplated copper layer, wherein said separating layer comprises a second insulating nitride layer over said top surface of said electroplated copper layer and over said top surface of said first insulating nitride layer; and a polymer layer on said separating layer, wherein an opening through said polymer layer and said separating layer is over a contact point of said top surface of said electroplated copper layer, and said contact point is at a bottom of said opening.

2. The integrated circuit chip of claim 1, wherein said second adhesion layer comprises titanium.

3. The integrated circuit chip of claim 1, wherein said second adhesion layer comprises a titanium-tungsten alloy.

4. The integrated circuit chip of claim 1, wherein there is an undercut with an edge of said second adhesion layer recessed from an edge of said electroplated copper layer.

5. The integrated circuit chip of claim 1, wherein said second adhesion layer comprises tantalum.

6. The integrated circuit chip of claim 1, wherein said second adhesion layer comprises a titanium nitride.

7. The integrated circuit chip of claim 1, wherein said second adhesion layer comprises a tantalum nitride.

8. The integrated circuit chip of claim 1, wherein said first insulating nitride layer has a thickness between 100 and 5000 Angstroms.

9. The integrated circuit chip of claim 1, wherein said first insulating nitride layer comprises silicon nitride.

10. The integrated circuit chip of claim 1, wherein said separating layer further comprises an oxide layer under said second insulating nitride layer, over said top surface of said electroplated copper layer and over said top surface of said first insulating nitride layer.

11. The integrated circuit chip of claim 1, wherein said second insulating nitride layer has a thickness greater than 4000 Angstroms.

12. The integrated circuit chip of claim 1, wherein said second metallization structure further comprises a seed layer on said second adhesion layer, wherein said electroplated copper layer is further on said seed layer.

13. The integrated circuit chip of claim 1, wherein said polymer layer has a thickness between 2 and 150 micrometers.

14. The integrated circuit chip of claim 1, wherein said polymer layer comprises polyimide.

15. The integrated circuit chip of claim 1, wherein said separating layer further comprises a PECVD oxide layer over said top surface of said first insulating nitride layer, over said top surface of said electroplated copper layer and under said second insulating nitride layer.

16. The integrated circuit chip of claim 1, wherein said second insulating nitride layer comprises silicon nitride.

17. The integrated circuit chip of claim 1, wherein said dielectric layer comprises a silicon-based oxide.

18. The integrated circuit chip of claim 1, wherein said separating layer further comprises a spin-on-glass layer over said first insulating nitride layer and under said second insulating nitride layer.

19. The integrated circuit chip of claim 1, wherein said separating layer further comprises a PECVD oxide layer over said first insulating nitride layer and a spin-on-glass layer over said PECVD oxide layer and under said second insulating nitride layer.

20. An integrated circuit chip comprising:
a semiconductor substrate;
multiple transistors in and on said semiconductor substrate;
an insulating layer over said semiconductor substrate;
a first metallization structure over said insulating layer, wherein said first metallization structure comprises a first metal layer and a second metal layer over said first metal layer, wherein said first metallization structure comprises a metal line comprising a copper portion, and said first metallization structure further comprises a first adhesion layer under said copper portion and at sidewalls of said metal line, wherein said metal line has a thickness less than 2 micrometers;
a dielectric layer between said first and second metal layers;
an insulating oxynitride layer over said first metallization structure and over said dielectric layer;
a second metallization structure on and in physical contact with a top surface of said insulating oxynitride layer, wherein said second metallization structure comprises a second adhesion layer on said insulating oxynitride layer, and a bulk metal layer over said second adhesion layer, wherein said second adhesion layer physically contacts said top surface of said insulating oxynitride layer, wherein said second adhesion layer is under said bulk metal layer, but is not at sidewalls of said bulk metal layer, wherein said bulk metal layer has a thickness greater than 3 micrometers;
a separating layer on said second metallization structure and on and in physical contact with said top surface of said insulating oxynitride layer, wherein said separating layer physically contacts a top surface of said bulk metal layer and said sidewalls of said bulk metal layer, wherein said separating layer comprises an insulating nitride layer over said top surface of said bulk metal layer and over said top surface of said insulating oxynitride layer; and
a polymer layer on said separating layer, wherein an opening through said polymer layer and said separating layer is over a contact point of said top surface of said bulk metal layer, and said contact point is at a bottom of said opening.

21. The integrated circuit chip of claim 20, wherein said bulk metal layer comprises a copper layer having a thickness greater than 3 micrometers.

22. The integrated circuit chip of claim 20, wherein said bulk metal layer comprises a gold layer having a thickness greater than 3 micrometers.

23. The integrated circuit chip of claim 20, wherein there is an undercut with an edge of said second adhesion layer recessed from an edge of said bulk metal layer.

24. The integrated circuit chip of claim 20, wherein said second adhesion layer comprises titanium.

25. The integrated circuit chip of claim 20, wherein said second adhesion layer comprises a titanium-tungsten alloy.

26. The integrated circuit chip of claim 20, wherein said second adhesion layer comprises tantalum.

27. The integrated circuit chip of claim 20, wherein said insulating oxynitride layer has a thickness between 100 and 5000 Angstroms.

28. The integrated circuit chip of claim 20, wherein said insulating oxynitride layer comprises silicon oxynitride.

29. The integrated circuit chip of claim 20, wherein said separating layer further comprises an oxide layer under said insulating nitride layer, over said top surface of said bulk metal layer and over said top surface of said insulating oxynitride layer.

30. The integrated circuit chip of claim 20, wherein said insulating nitride layer has a thickness greater than 4000 Angstroms.

31. The integrated circuit chip of claim 20, wherein said second metallization structure further comprises a seed layer on said second adhesion layer, wherein said bulk metal layer is further on said seed layer.

32. The integrated circuit chip of claim 20, wherein said polymer layer has a thickness between 2 and 150 micrometers.

33. The integrated circuit chip of claim 20, wherein said polymer layer comprises polyimide.

34. The integrated circuit chip of claim 20, wherein said insulating nitride layer comprises silicon nitride.

35. The integrated circuit chip of claim 20, wherein said separating layer further comprises a PECVD oxide layer over said top surface of said insulating oxynitride layer, over said top surface of said bulk metal layer and under said insulating nitride layer.

36. The integrated circuit chip of claim 20, wherein said dielectric layer comprises a silicon-based oxide.

37. The integrated circuit chip of claim 20, wherein said separating layer further comprises a spin-on-glass layer over said insulating oxynitride layer and under said insulating nitride layer.

38. The integrated circuit chip of claim 20, wherein said separating layer further comprises a PECVD oxide layer over said insulating oxynitride layer and a spin-on-glass layer over said PECVD oxide layer and under said insulating nitride layer.

39. An integrated circuit chip comprising:
a semiconductor substrate;
multiple transistors in and on said semiconductor substrate;
an insulating layer over said semiconductor substrate;
a first metallization structure over said insulating layer, wherein said first metallization structure comprises a first metal layer and a second metal layer over said first metal layer, wherein said first metallization structure comprises a metal line comprising a copper portion, and said first metallization structure further comprises a first adhesion layer under said copper portion and at sidewalls of said metal line, wherein said metal line has a thickness less than 2 micrometers;
a dielectric layer between said first and second metal layers;
a first insulating nitride layer over said first metallization structure and over said dielectric layer;
a second metallization structure on and in physical contact with a top surface of said first insulating nitride layer, wherein said second metallization structure comprises a second adhesion layer on said first insulating nitride layer, and a bulk metal layer over said second adhesion layer, wherein said second adhesion layer physically contacts said top surface of said first insulating nitride layer, wherein said second adhesion layer is under said bulk metal layer, but is not at sidewalls of said bulk metal layer, wherein said bulk metal layer has a thickness greater than 3 micrometers;
a separating layer on said second metallization structure and on and in physical contact with said top surface of said first insulating nitride layer, wherein said separating layer physically contacts a top surface of said bulk metal layer and said sidewalls of said bulk metal layer, wherein said separating layer comprises a second insulating nitride layer over said top surface of said bulk metal layer and over said top surface of said first insulating nitride layer; and
a polymer layer on said separating layer, wherein an opening through said polymer layer and said separating layer is over a contact point of said top surface of said bulk metal layer, and said contact point is at a bottom of said opening.

40. The integrated circuit chip of claim 39, wherein said second adhesion layer comprises titanium.

41. The integrated circuit chip of claim 39, wherein said second adhesion layer comprises a titanium-tungsten alloy.

42. The integrated circuit chip of claim 39, wherein there is an undercut with an edge of said second adhesion layer recessed from an edge of said bulk metal layer.

43. The integrated circuit chip of claim 39, wherein said second adhesion layer comprises tantalum.

44. The integrated circuit chip of claim 39, wherein said second adhesion layer comprises a titanium nitride.

45. The integrated circuit chip of claim 39, wherein said second adhesion layer comprises a tantalum nitride.

46. The integrated circuit chip of claim 39, wherein said separating layer further comprises an oxide layer under said second insulating nitride layer, over said top surface of said bulk metal layer and over said top surface of said first insulating nitride layer.

47. The integrated circuit chip of claim 39, wherein said second insulating nitride layer has a thickness greater than 4000 Angstroms.

48. The integrated circuit chip of claim 39, wherein said bulk metal layer comprises a copper layer having a thickness greater than 3 micrometers.

49. The integrated circuit chip of claim 39, wherein said polymer layer has a thickness between 2 and 150 micrometers.

50. The integrated circuit chip of claim 39, wherein said polymer layer comprises polyimide.

51. The integrated circuit chip of claim 39, wherein said second metallization structure further comprises a seed layer on said second adhesion layer, wherein said bulk metal layer is further on said seed layer.

52. The integrated circuit chip of claim 39, wherein said first insulating nitride layer has a thickness between 100 and 5000 Angstroms.

53. The integrated circuit chip of claim 39, wherein said first insulating nitride layer comprises silicon nitride.

54. The integrated circuit chip of claim 39, wherein said dielectric layer comprises a silicon-based oxide.

55. The integrated circuit chip of claim 39, wherein said second insulating nitride layer comprises silicon nitride.

56. The integrated circuit chip of claim 39, wherein said separating layer further comprises a spin-on-glass layer over said first insulating nitride layer and under said second insulating nitride layer.

57. An integrated circuit chip comprising:
a semiconductor substrate;
multiple transistors in and on said semiconductor substrate;
an insulating layer over said semiconductor substrate;
a metallization structure over said insulating layer, wherein said metallization structure comprises a first metal layer and a second metal layer over said first metal layer, wherein said metallization structure comprises a metal line comprising a copper portion, and said metallization structure further comprises a first adhesion layer under said copper portion and at sidewalls of said metal line, wherein said metal line has a thickness less than 2 micrometers;
a dielectric layer between said first and second metal layers;
a first insulating nitride layer over said metallization structure and over said dielectric layer;

a first metal interconnect on and in physical contact with a top surface of said first insulating nitride layer, wherein said first metal interconnect is connected to said metallization structure through a first opening in said first insulating nitride layer;

a second metal interconnect on and in physical contact with said top surface of said first insulating nitride layer, wherein said second metal interconnect comprises a second adhesion layer on said top surface of said first insulating nitride layer, and an electroplated copper layer over said second adhesion layer, wherein said second adhesion layer physically contacts said top surface of said first insulating nitride layer, wherein said second adhesion layer is under said electroplated copper layer, but is not at sidewalls of said electroplated copper layer, wherein said electroplated copper layer has a thickness greater than 3 micrometers;

a second insulating nitride layer over said first and second metal interconnects, over said top surface of said first insulating nitride layer and between said first and second metal interconnects; and a polymer layer on said second insulating nitride layer and between said first and second metal interconnects, wherein a second opening through said polymer layer and said second insulating nitride layer is over a contact point of said electroplated copper layer of said second metal interconnect, and said contact point is at a bottom of said second opening.

58. The integrated circuit chip of claim 57, wherein said second adhesion layer comprises titanium.

59. The integrated circuit chip of claim 57, wherein said first insulating nitride layer has a thickness between 100 and 5000 Angstroms.

60. The integrated circuit chip of claim 57, wherein said first insulating nitride layer comprises silicon nitride.

61. The integrated circuit chip of claim 57, wherein said second insulating nitride layer has a thickness greater than 4000 Angstroms.

62. The integrated circuit chip of claim 57, wherein said second metal interconnect further comprises a seed layer on said second adhesion layer, wherein said electroplated copper layer is further on said seed layer.

63. The integrated circuit chip of claim 57, wherein said polymer layer has a thickness between 2 and 150 micrometers.

64. The integrated circuit chip of claim 57, wherein said second insulating nitride layer comprises silicon nitride.

65. The integrated circuit chip of claim 57, wherein said dielectric layer comprises a silicon-based oxide.

66. An integrated circuit chip comprising:
a semiconductor substrate;
multiple transistors in and on said semiconductor substrate;
a metallization structure over said semiconductor substrate, wherein said metallization structure comprises a first metal layer and a second metal layer over said first metal layer, wherein said metallization structure comprises a metal line comprising a copper portion, and said metallization structure further comprises a first adhesion layer under said copper portion and at sidewalls of said metal line, wherein said metal line has a thickness less than 2 micrometers;
a dielectric layer between said first and second metal layers;
a first insulating layer over said metallization structure and over said dielectric layer;

a first metal interconnect on and in physical contact with a top surface of said first insulating layer, wherein said first metal interconnect is connected to said metallization structure through a first opening in said first insulating layer;

a second metal interconnect on and in physical contact with said top surface of said first insulating layer, wherein said second metal interconnect comprises a second adhesion layer on said top surface of said first insulating layer, and a third metal layer over said second adhesion layer, wherein said second adhesion layer physically contacts said top surface of said first insulating layer, wherein said second adhesion layer is under said third metal layer, but is not at sidewalls of said third metal layer;

a second insulating layer over said first and second metal interconnects, over said top surface of said first insulating layer and between said first and second metal interconnects, wherein said second insulating layer comprises a nitride layer, wherein a second opening in said second insulating layer is over a contact point of said third metal layer of said second metal interconnect; and a polymer layer on said second insulating layer and between said first and second metal interconnects, wherein a third opening in said polymer layer is over said contact point.

67. The integrated circuit chip of claim 66, wherein said second adhesion layer comprises titanium.

68. The integrated circuit chip of claim 66, wherein said second adhesion layer comprises tantalum.

69. The integrated circuit chip of claim 66, wherein said second adhesion layer comprises titanium nitride.

70. The integrated circuit chip of claim 66, wherein said second adhesion layer comprises tantalum nitride.

71. The integrated circuit chip of claim 66, wherein said first insulating layer comprises a silicon-nitride layer.

72. The integrated circuit chip of claim 71, wherein no polymer layer is between said silicon-nitride layer of said first insulating layer and said second metal interconnect.

73. The integrated circuit chip of claim 66, wherein said first insulating layer comprises a silicon-oxynitride layer.

74. The integrated circuit chip of claim 73, wherein no polymer layer is between said silicon-oxynitride layer of said first insulating layer and said second metal interconnect.

75. The integrated circuit chip of claim 66, wherein said first insulating layer comprises a silicon-and-oxygen-containing layer.

76. The integrated circuit chip of claim 75, wherein no polymer layer is between said silicon-and-oxygen-containing layer of said first insulating layer and said second metal interconnect.

77. The integrated circuit chip of claim 66, wherein said first insulating layer comprises a silicon-nitride layer having a thickness between 100 and 5000 Angstroms.

78. The integrated circuit chip of claim 66, wherein said first insulating layer comprises a silicon-oxynitride layer having a thickness between 100 and 5000 Angstroms.

79. The integrated circuit chip of claim 66, wherein said first insulating layer comprises a silicon-and-oxygen-containing layer having a thickness between 100 and 5000 Angstroms.

80. The integrated circuit chip of claim 66, wherein said nitride layer has a thickness greater than 4000 Angstroms.

81. The integrated circuit chip of claim 66, wherein said nitride layer comprises silicon nitride.

82. The integrated circuit chip of claim 66, wherein said third metal layer comprises an electroplated copper layer having a thickness greater than 3 micrometers.

83. The integrated circuit chip of claim 66, wherein said third metal layer comprises an electroplated gold layer.

84. The integrated circuit chip of claim 66, wherein said third metal layer comprises copper.

85. The integrated circuit chip of claim 66, wherein said second metal interconnect further comprises a seed layer on said second adhesion layer, wherein said third metal layer is further on said seed layer.

86. The integrated circuit chip of claim 66, wherein said polymer layer has a thickness between 2 and 150 micrometers.

87. The integrated circuit chip of claim 66, wherein said dielectric layer comprises a silicon-based oxide.

88. The integrated circuit chip of claim 66, wherein said third opening has a sidewall not covered by said second insulating layer.

* * * * *

UNITED STATES PATENT AND TRADEMARK OFFICE
CERTIFICATE OF CORRECTION

PATENT NO. : 8,552,559 B2  
APPLICATION NO. : 11/087955  
DATED : October 8, 2013  
INVENTOR(S) : Mou-Shiung Lin et al.

Page 1 of 1

It is certified that error appears in the above-identified patent and that said Letters Patent is hereby corrected as shown below:

On the Title Page:

Item (73) Assignee, please delete "Megica Corporation, Hsinchu (TW)" and add --Megit Acquisitions Corp., San Diego, CA (US)--

Signed and Sealed this  
Twenty-first Day of April, 2015

Michelle K. Lee  
*Director of the United States Patent and Trademark Office*